(12) United States Patent
Fang et al.

(10) Patent No.: US 7,122,472 B2
(45) Date of Patent: Oct. 17, 2006

(54) METHOD FOR FORMING SELF-ALIGNED DUAL FULLY SILICIDED GATES IN CMOS DEVICES

(75) Inventors: Sunfei Fang, LaGrangeville, NY (US); Cyril Cabral, Jr., Mahopac, NY (US); Chester T. Dziobkowski, Hopewell Junction, NY (US); Christian Lavoie, Ossining, NY (US); Clement H. Wann, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 10/904,885

(22) Filed: Dec. 2, 2004

(65) Prior Publication Data

US 2006/0121663 A1    Jun. 8, 2006

(51) Int. Cl.
*H01L 21/44* (2006.01)
(52) U.S. Cl. .............. 438/664; 438/592; 438/682; 438/683; 257/388; 257/407; 257/412
(58) Field of Classification Search ............... 438/199, 438/664
See application file for complete search history.

(56) References Cited

U.S. PATENT DOCUMENTS

| | | | |
|---|---|---|---|
| 6,100,173 A | 8/2000 | Gardner et al. | 438/592 |
| 6,524,939 B1 | 2/2003 | Tseng | 438/592 |
| 6,528,402 B1 | 3/2003 | Tseng | 438/592 |
| 6,534,405 B1 | 3/2003 | Wu | 438/682 |
| 6,562,718 B1 | 5/2003 | Xiang et al. | 438/682 |
| 6,589,836 B1 | 7/2003 | Wang et al. | 438/231 |
| 6,905,922 B1 * | 6/2005 | Lin et al. | 438/199 |
| 2002/0119632 A1 | 8/2002 | Tseng | 438/305 |
| 2004/0063285 A1 * | 4/2004 | Pham et al. | 438/275 |
| 2006/0011996 A1 * | 1/2006 | Wu et al. | 257/412 |

OTHER PUBLICATIONS

Wolf et al, Silicon Processing for the VLSI Era, vol. 1: Processing Technology, 2nd Ed., Lattice Press: Sunset Beach, CA, 2000, pp. 816-819.*
U.S. Appl. No. 10/904,884, filed Dec. 2, 2004, entitled "Method for Forming Self-Aligned Dual Salicide In CMOS Technologies".
U.S. Appl. No. 10/890,753, filed Jul. 14, 2004, entitled "Formation of Fully Silicided Metal Gate Using Dual Self-Aligned Silicide Process".
U.S. Appl. No. 10/725,851, filed Dec. 2, 2003, entitled "Method For Integration of Silicide Contacts And Silicide Gate Metals".

* cited by examiner

*Primary Examiner*—Carl Whitehead, Jr.
*Assistant Examiner*—Colleen E. Rodgers
(74) *Attorney, Agent, or Firm*—Gibb I.P. Law Firm, LLC; James J. Cioffi, Esq.

(57) ABSTRACT

A method of forming a dual self-aligned fully silicided gate in a CMOS device requiring only one lithography level, wherein the method comprises forming a first type semiconductor device having a first well region in a semiconductor substrate, first source/drain silicide areas in the first well region, and a first type gate isolated from the first source/drain silicide areas; forming a second type semiconductor device having a second well region in the semiconductor substrate, second source/drain silicide areas in the second well region, and a second type gate isolated from the second source/drain silicide areas; selectively forming a first metal layer over the second type semiconductor device; performing a first fully silicided (FUSI) gate formation on only the second type gate; depositing a second metal layer over the first and second type semiconductor devices; and performing a second FUSI gate formation on only the first type gate.

36 Claims, 18 Drawing Sheets

FIG. 18

| | |
|---|---|
| FORMING A FIRST TYPE SEMICONDUCTOR DEVICE HAVING A FIRST WELL REGION IN A SEMICONDUCTOR SUBSTRATE, FIRST SOURCE/DRAIN SILICIDE ARAS IN THE FIRST WELL REGION, AND A FIRST TYPE GATE REGION ISOLATED FROM THE FIRST SOURCE/DRAIN SILICIDE AREAS. | 601 |
| FORMING A SECOND TYPE SEMICONDUCTOR DEVICE HAVING A SECOND WELL REGION IN THE SEMICONDUCTOR SUBSTRATE, SECOND SOURCE/DRAIN SILICIDE AREAS IN THE SECOND WELL REGION, AND A SECOND TYPE GATE REGION ISOLATED FROM THE SECOND SOURCE/DRAIN SILICIDE AREAS. | 603 |
| SELECTIVELY FORMING A FIRST METAL LAYER OVER THE SECOND TYPE SEMICONDUCTOR DEVICE. | 605 |
| PERFORMING A FIRST FUSI GATE FORMATION ON ONLY THE SECOND TYPE GATE REGION. | 607 |
| DEPOSITING A SECOND METAL LAYER OVER THE FIRST TYPE SEMICONDUCTOR DEVICE AND THE SECOND TYPE SEMICONDUCTOR DEVICE. | 609 |
| PERFORMING A SECOND FUSI GATE FORMATION ON ONLY THE FIRST TYPE GATE REGION. | 611 |

METHOD FOR FORMING SELF-ALIGNED DUAL FULLY SILICIDED GATES IN CMOS DEVICES

CROSS REFERENCE TO RELATED APPLICATION

This application relates to co-pending U.S. patent application entitled "Method for Forming Self-Aligned Dual Salicide in CMOS Technologies" U.S. patent application Ser. No. 10/904,884, filed concurrently herewith, the contents of which in its entirety is herein incorporated by reference.

BACKGROUND OF THE INVENTION

1. Field of the Invention

The embodiments of the invention generally relate to complementary metal oxide semiconductor (CMOS) device fabrication, and more particularly to a method of forming self-aligned dual fully silicided (FUSI) gates in CMOS technologies to improve device performance.

2. Description of the Related Art

A polysilicon gate is commonly used in CMOS technology. Polysilicon gates have polysilicon depletion that effectively increases the equivalent gate dielectric thickness, thus degrading device performance. Fully silicided (FUSI) gates eliminate the problem of polysilicon depletion. FUSI gates also reduce the gate conductance that can further improve device performance. A FUSI gate can be formed by depositing a metal layer (such as Ti, Co, Ni, etc.) over an exposed polysilicon gate region, and then annealing the semiconductor structure. The metal reacts with the exposed polysilicon gate to transform the polysilicon gate fully into a silicided gate. FUSI gates normally have a work function near the middle of the silicon band structure. However, CMOS devices normally require a conductive gate with a work function near the band edge; i.e., near the conduction band for an NFET and near the valence band for a PFET, respectively. This imposes a significant challenge for CMOS technologies with FUSI gates, since it likely requires different FUSI gates to be formed for each of the NFET and PFET portions of the CMOS device.

FIGS. 1 through 4 illustrate iterative steps of a conventional method to form a CMOS device 51 with dual fully silicided gate (i.e., a CMOS device 51 formed of two different fully silicided gate materials for the NFET and PFET). FIG. 1 illustrates a starting CMOS device structure 51 with exposed polysilicon gates 58, 63 for the NFET 80 and PFET 70, respectively. The CMOS device 51 consists of a substrate 52 with Nwell (N-type retrograde well) and Pwell (P-type retrograde well) regions 53, 54, respectively configured therein. Shallow trench isolation regions 55 are also included in the CMOS device 51. The NFET portion 80 of the CMOS device 51 comprises a NFET gate 58. Additionally, insulative sidewall spacers 59 are configured around the NFET gate 58. A NFET gate dielectric 57 is positioned below the NFET gate 58. Moreover, NFET source/drain implant regions 68 comprising NFET source/drain silicide areas 56 are also formed in the Pwell region 54 on opposite sides of the NFET gate 58.

Likewise, the PFET portion 70 of the CMOS device 51 comprises a PFET gate 63. Additionally, insulative sidewall spacers 61 are configured around the PFET gate 63. A PFET gate dielectric 62 is positioned below the PFET gate 63. Additionally, PFET source/drain implant regions 69 comprising PFET source/drain silicide areas 66 are also formed in the Nwell region 53 on opposite sides of the PFET gate 63. Furthermore, a dielectric film 60 is formed planar with the NFET and PFET gates 58, 63 and above the NFET and PFET source/drain silicide areas 56, 66.

Generally, as illustrated in FIG. 2, the dual FUSI gate process involves depositing a first silicide block film 65 over the entire device 51. Then, a first lithographic pattern and etching process is performed to remove a portion of the blocking film 65 over the NFET region 80 of the device 51. A silicide process is performed on the NFET gate 58 to form a fully silicided gate region 158.

Next, as shown in FIG. 3, the first blocking film 65 is removed from the device 51, and a second silicide blocking film 67 is deposited over the entire device 51. Then, a second lithographic pattern and etching process is performed to remove a portion of the blocking film 67 over the PFET region 70 of the device 51. Thereafter, a silicide process is performed on the PFET gate region 63 to form a FUSI gate 163. As shown in FIG. 4, the second blocking film 67 is completely removed. Additionally, as indicated in FIG. 4, the material of the NFET FUSI gate 158 is different from the material of the PFET FUSI gate 163 of the device 51.

However, one of the problems with the conventional two lithography level dual FUSI gate process as provided in FIGS. 1 through 4 is the misalignment caused during the processing between the two lithography levels as illustrated in FIG. 5 (the dotted circle represents the area of the device 51 where the misalignment occurs). This misalignment between the NFET FUSI gate 158 of the NFET region 80 and the PFET FUSI gate 163 of the PFET region 70 results in an underlay in the device 51 (illustrated in FIG. 5 as a SRAM (synchronous random access memory) cell layout), which can cause high sheet resistance or an open circuit in the device and/or circuit areas thereby resulting in inferior device/circuit performance. Therefore, there remains a need for a novel dual FUSI gate formation process, which overcomes this misalignment problem.

SUMMARY OF THE INVENTION

In view of the foregoing, an embodiment of the invention provides a method of fabricating a self-aligned dual fully silicided (FUSI) gate in a complementary metal oxide semiconductor (CMOS) device, wherein the method comprises forming a first type semiconductor device having a first well region in a semiconductor substrate, first source/drain silicide areas in the first well region, and a first type gate region isolated from the first source/drain silicide areas; forming a second type semiconductor device having a second well region in the semiconductor substrate, second source/drain silicide areas in the second well region, and a second type gate isolated from the second source/drain silicide areas; forming a dielectric layer over each of the first and second source/drain silicide areas; shielding the first type semiconductor device with a mask; depositing a first metal layer over the second type semiconductor device; performing a first FUSI gate formation on the second type gate region; removing the mask; depositing a second metal layer over the first and second type semiconductor devices; and performing a second FUSI gate formation on the first type gate region.

Moreover, in a first embodiment, the first well region is configured as a NFET (N-type field effect transistor) well region and the second well region is configured as a PFET (P-type field effect transistor) well region. In a second embodiment, the first well region is configured as a PFET well region and the second well region is configured as a NFET well region.

The first metal layer is formed of different materials than the second metal layer. Furthermore, the first type semiconductor device is formed by configuring an insulator layer over the first well region; configuring the first type gate region over the insulator layer; and forming insulative spacers on opposite sides of the first type gate region. The second FUSI gate formation is performed on an entirety of the first type gate region. The entirety of the first type gate region comprises an area extending from a lower surface of the first type gate region contacting the insulator layer to an upper surface of the first type gate region. Moreover, the second type semiconductor device is formed by configuring an insulator layer over the second well region; configuring the second type gate region over the insulator layer; and forming insulative spacers on opposite sides of the second type gate region. Additionally, the first FUSI gate formation is performed on an entirety of the second type gate region, wherein the entirety of the second type gate region comprises an area extending from a lower surface of the second type gate region contacting the insulator layer to an upper surface of the second type gate region.

The first metal layer and the second metal layer are formed of any of Ti, Co, Ni, Pt, Re, W, Pd, Ta, and their alloys. The method further comprises forming a cap layer over each of the first metal layer and the second metal layer, wherein the cap layer comprises any of TiN, Ti, and TaN, wherein each of the first and second type gate regions comprise polysilicon material, and wherein each of the first and second FUSI gate formations comprise performing a first annealing process to convert the polysilicon material into a metal rich silicide having a first level silicide sheet resistance; removing the cap layer; and performing a second annealing process to convert the metal rich silicide into silicide having a second level silicide sheet resistance lower than the first level silicide sheet resistance.

Another embodiment of the invention provides a method of manufacturing an integrated circuit comprising FUSI gates over a semiconductor substrate, wherein the method comprises forming a first type semiconductor device having a first well region in the semiconductor substrate, first source/drain silicide areas in the first well region, and a first type gate region isolated from the first source/drain silicide areas; forming a second type semiconductor device having a second well region in the semiconductor substrate, second source/drain silicide areas in the second well region, and a second type gate region isolated from the second source/drain silicide areas; selectively forming a first metal layer over the second type semiconductor device; performing a first FUSI gate formation on only the second type gate region; depositing a second metal layer over the first type semiconductor device and the second type semiconductor device; and performing a second FUSI gate formation on only the first type gate region, wherein the first metal layer is formed of different materials than the second metal layer, and wherein the first metal layer and second metal layer are formed of any of Ti, Co, Ni, Pt, Re, W, Pd, Ta, and their alloys.

The first type semiconductor device is formed by configuring an insulator layer over the first well region; configuring the first type gate region over the insulator layer; and forming insulative spacers on opposite sides of the first type gate region, wherein the second FUSI gate formation is performed on an entirety of the first type gate region, and wherein the entirety of the first type gate region comprises an area extending from a lower surface of the first type gate region contacting the insulator layer to an upper surface of the first type gate region.

In a first embodiment, the first well region is configured as any of a NFET well region and a PFET well region. In a second embodiment, the second well region is configured as any of a NFET well region and a PFET well region. The second type semiconductor device is formed by configuring an insulator layer over the second well region; configuring the second type gate region over the insulator layer; and forming insulative spacers on opposite sides of the second type gate region, wherein the first FUSI gate formation is performed on an entirety of the second type gate region, and wherein the entirety of the second type gate region comprises an area extending from a lower surface of the second type gate region contacting the insulator layer to an upper surface of the second type gate region.

The method further comprises forming a cap layer over each of the first metal layer and the second metal layer, wherein the cap layer comprises any of TiN, Ti, and TaN, wherein each of the first and second type gate regions comprise polysilicon material, and wherein each of the first and second FUSI gate formations comprise performing a first annealing process to convert the polysilicon material into a metal rich silicide having a first level silicide sheet resistance; removing the cap layer; and performing a second annealing process to convert the metal rich silicide into silicide having a second level silicide sheet resistance lower than the first level silicide sheet resistance.

Generally, the embodiments of the invention provide a self-aligning dual FUSI gate formation (i.e., different salicide formations), such as NiSi, $CoSi_2$, $TiSi_2$, $WSi_2$, PdSi, PtSi, $TaSi_2$, ReSi, etc., and their alloys at the gate areas for NFET and PFET regions of a CMOS device with only one lithography level. As such, the embodiments of the invention reduce the required lithography level, greatly simplify the dual salicide formation process, and eliminate the misalignment problem associated with some conventional techniques. Moreover, the embodiments of the invention enable the optimization of the performance of the CMOS device by forming one salicide in the NFET gate region and a different salicide in the PFET gate region.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 18 is a flow diagram illustrating a preferred method according to an embodiment of the invention.

DETAILED DESCRIPTION OF PREFERRED EMBODIMENTS OF THE INVENTION

Figure 1:
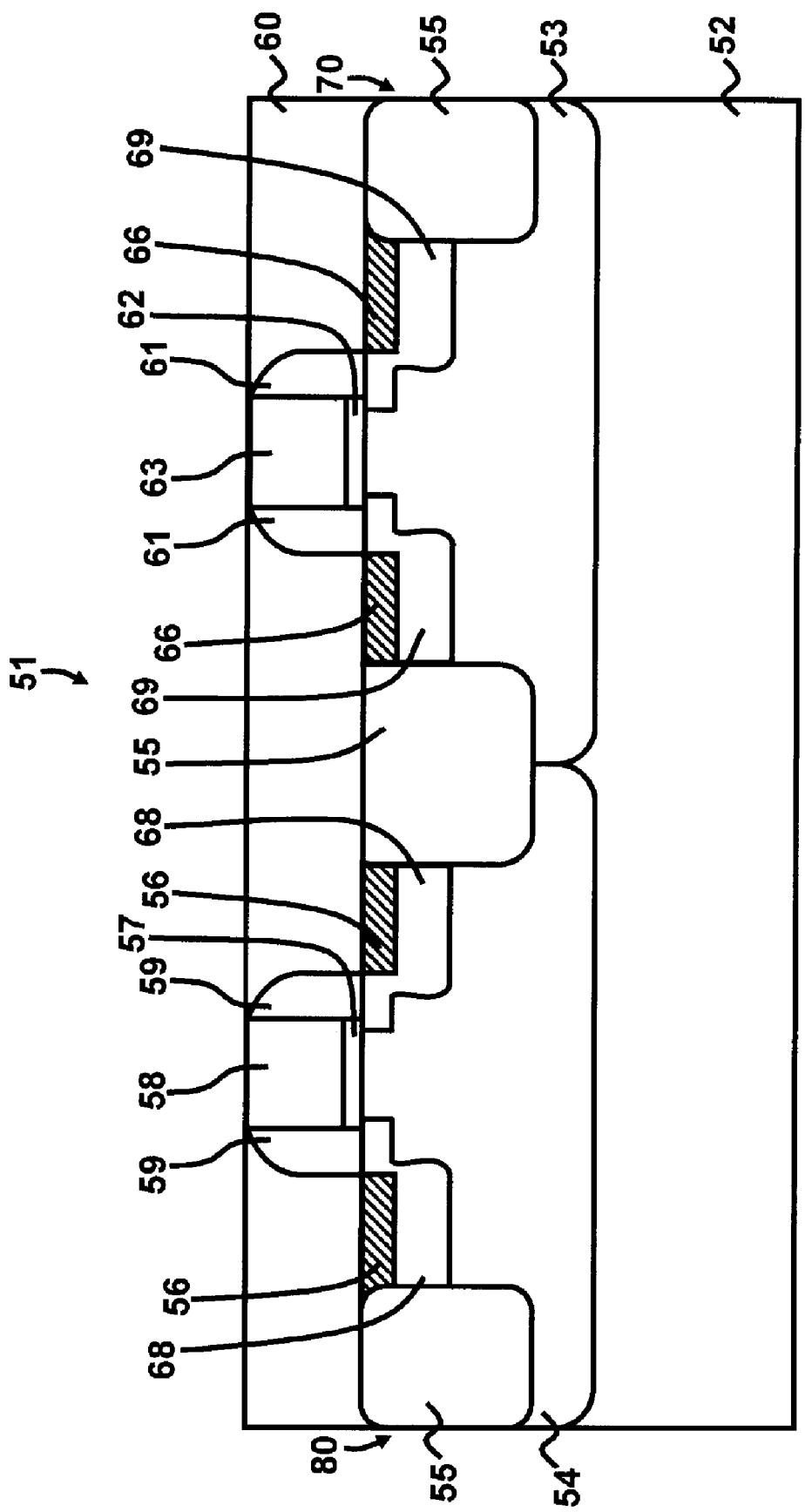
FIGS. 1 through 4 are schematic diagrams illustrating iterative steps of fabricating a conventional self-aligned dual fully silicided gate CMOS device.
Figure 2:
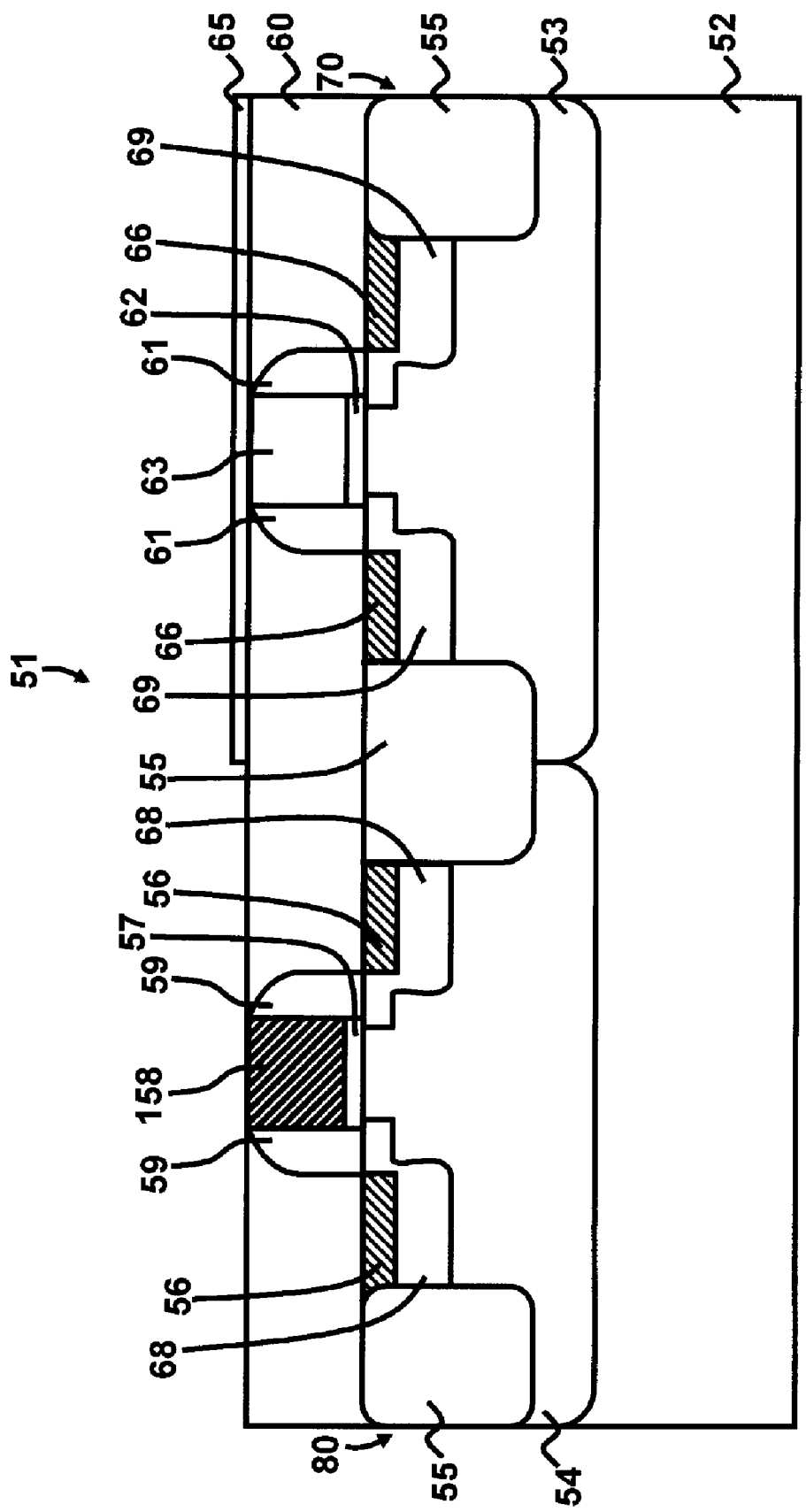
Figure 3:
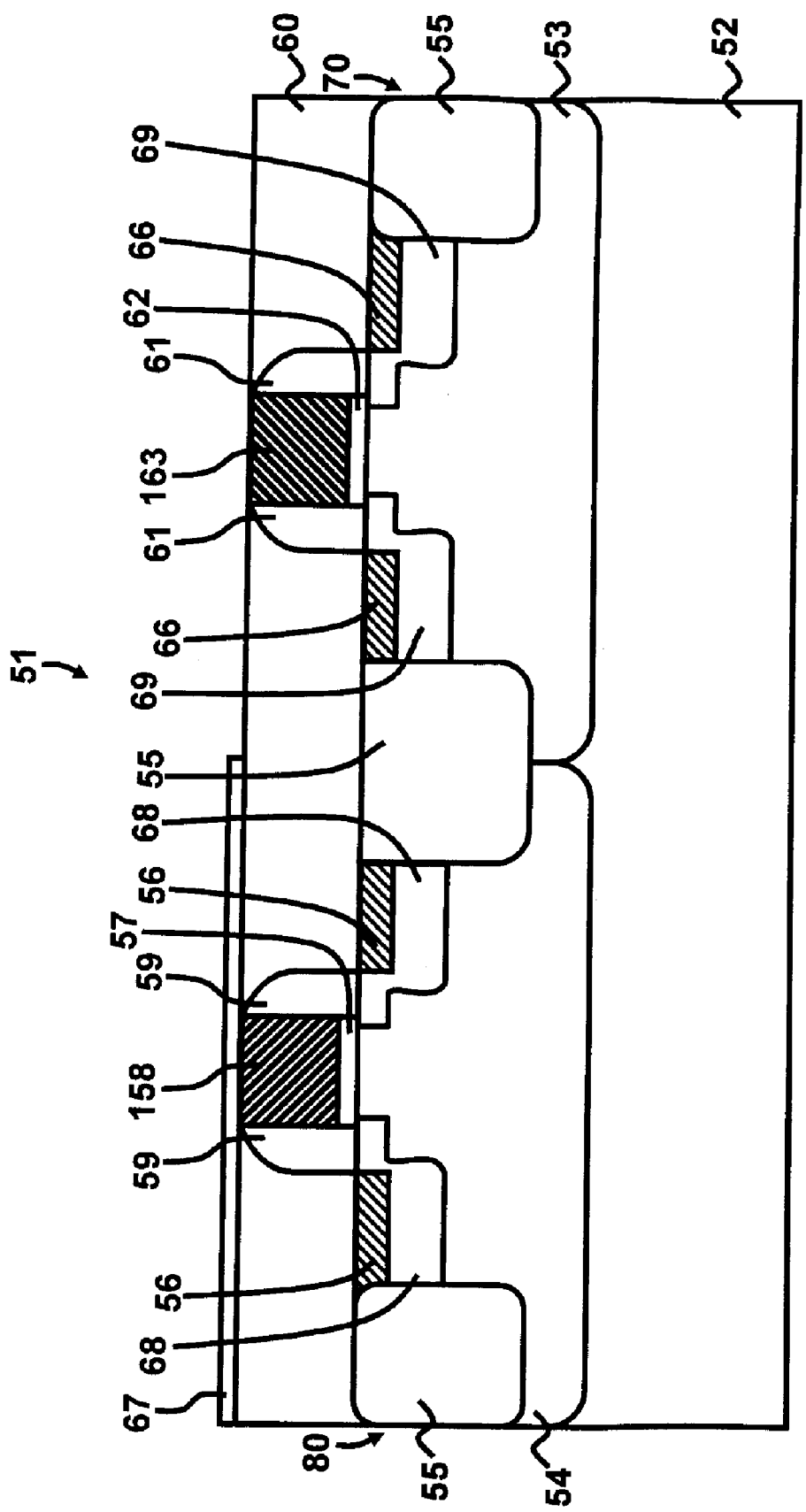
Figure 4:
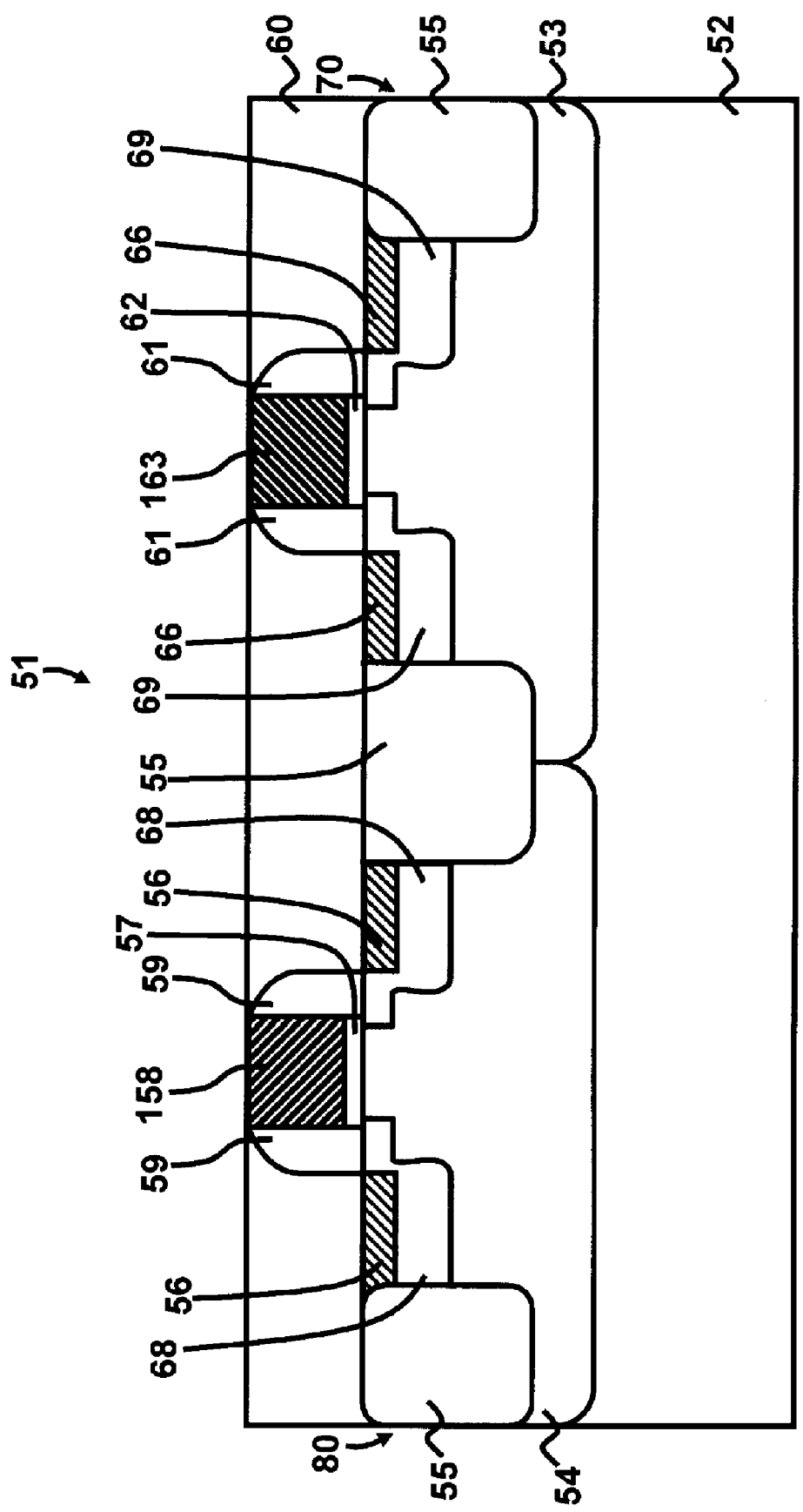
Figure 5:
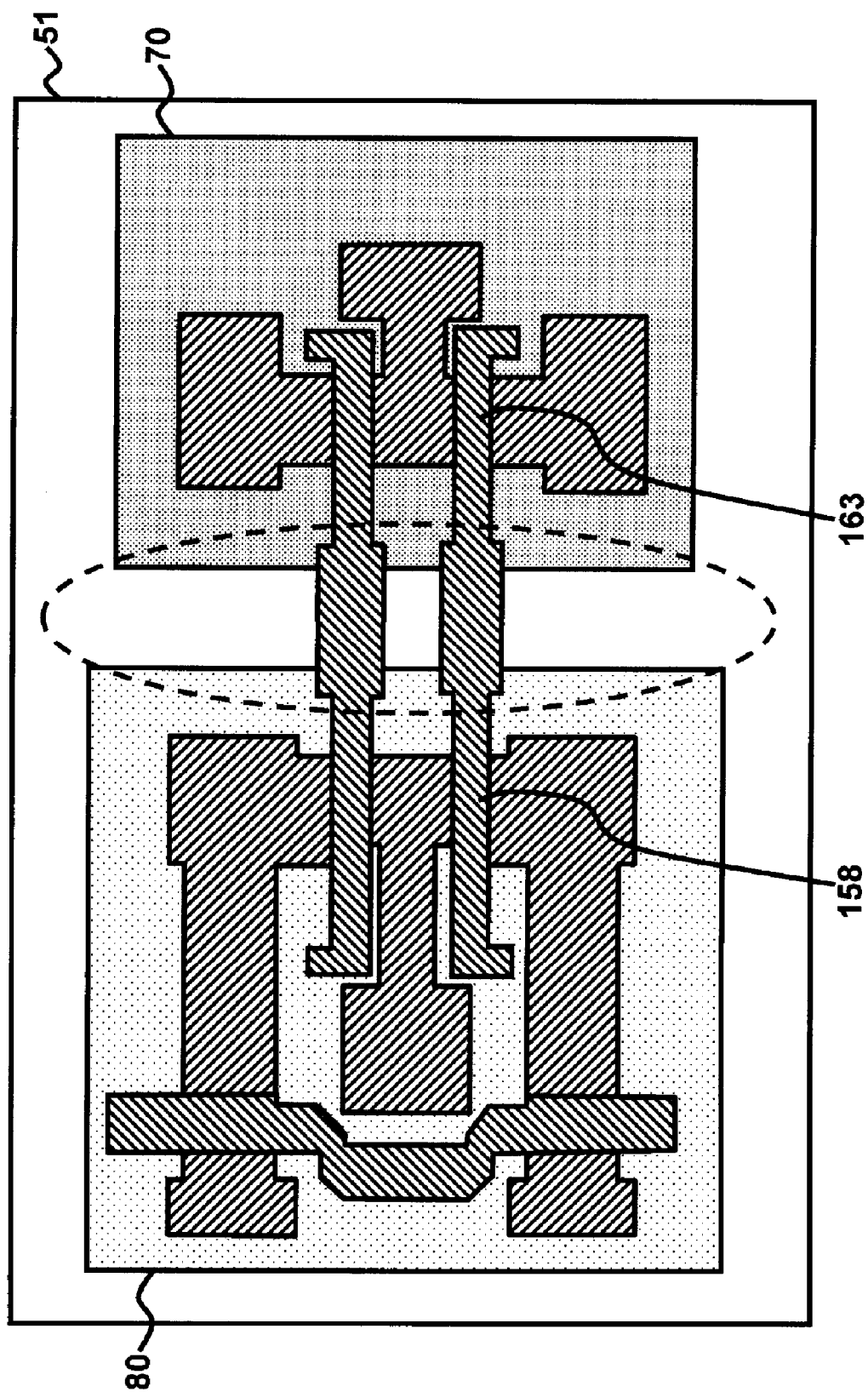
FIG. 5 is a schematic diagram illustrating a conventional SRAM cell layout with a CMOS device.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel dual fully silicided (FUSI) gate formation process, which overcomes the misalignment problem typical in conventional dual FUSI gate processing. The embodiments of the invention achieve this need by providing simplified manufacturing methods to form self-aligned dual FUSI gates, which require only one lithography pattern level thereby eliminating pattern overlay. Referring now to the drawings and more particularly to FIGS. 6 through 18 where similar reference characters denote corresponding features consistently throughout the figures, there are shown preferred embodiments of the invention.

Figure 6:
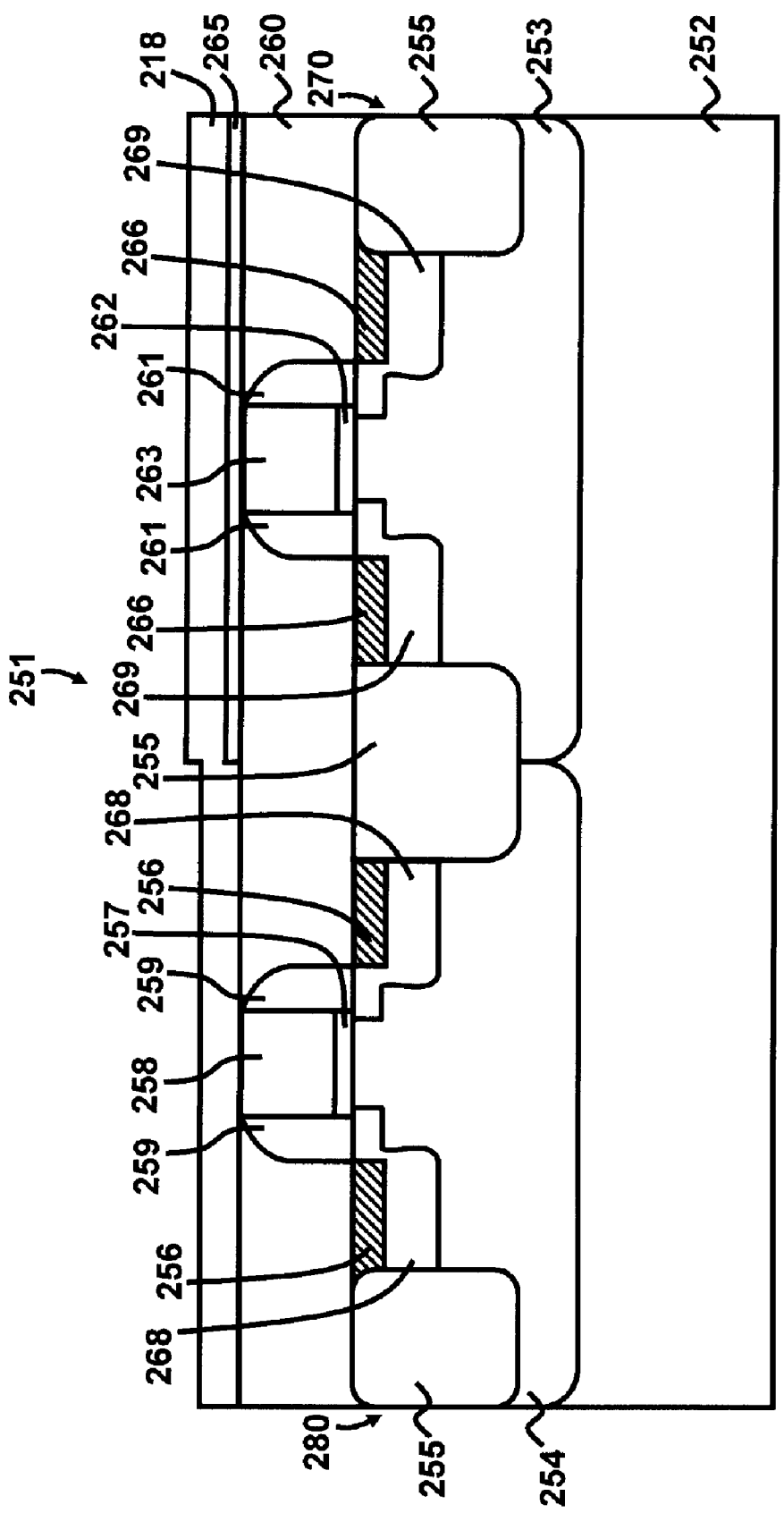
FIGS. 6 through 9 are schematic diagrams illustrating iterative steps of fabricating a self-aligned dual FUSI gate CMOS device according to a first embodiment of the invention.

FIGS. 6 through 9 illustrate iterative steps of fabricating a dual FUSI gate CMOS device 251 according to a first embodiment of the invention. As illustrated in FIG. 6, the FUSI gate formation process, according to the first embodiment of the invention, involves depositing a first silicide blocking film (for example, dielectric, oxide, nitride, or TiN film) 265 over the entire device 251, and specifically over a dielectric film 260. Then, a first (and only) lithographic pattern and etching process is performed to remove a portion of the blocking film 265 over the NFET region 280 of the device 251. The NFET region 280 comprises a Pwell 254 formed in a substrate 252 with NFET source/drain implant regions 268 comprising NFET source/drain silicide areas (contacts) 256, preferably comprising $TiSi_2$, $CoSi_2$, NiSi, PtSi, or their alloys, formed in the Pwell 254, with a NFET gate dielectric 257, preferably comprising any of oxide, nitridated oxide, or a high-k material, formed over the Pwell 254, and with a NFET gate 258 formed over the gate dielectric 257. A pair of insulative sidewalls 259, preferably comprising any of oxide, nitride, or oxynitride, is also fanned around the NFET gate 258. Additionally, shallow trench isolation regions 255 are also included in the CMOS device 251 to provide electrical isolation between various devices in the CMOS device 251.

In one embodiment, the substrate 252 comprises a single-crystal silicon layer. Alternatively, the substrate 252 may comprise any appropriate semiconducting material, including, but not limited to silicon (Si), germanium (Ge), gallium phosphide (GaP), indium arsenide (InAs), indium phosphide (InP), silicon germanium (SiGe), gallium arsenide (GaAs), or other semiconductors. The remaining portion of the blocking film 265 protects the PFET region 270 of the device 251. The PFET region 270 is similarly configured to the NFET region 280, wherein the PFET region 270 includes a Nwell 253 formed in the substrate 252 with PFET source/drain implant regions 269 comprising PFET source/drain silicide areas (contacts) 266, preferably comprising $TiSi_2$, $CoSi_2$, NiSi, PtSi, or their alloys, formed in the Nwell 253, with a PFET gate dielectric 262, preferably comprising any of oxide, nitridated oxide, or a high-k material, formed over the Nwell 253, and with a PFET gate 263 formed over the PFET gate dielectric 262. A pair of insulative sidewalls 261, preferably comprising any of oxide, nitride, or oxynitride, is formed around the PFET gate 263 as well. Moreover, the retrograde well regions (Pwell 254 and Nwell 253) may be formed using any well-known technique such as high-energy ion implantation and annealing. Furthermore, the dielectric film 260, which may comprise oxide or nitride (preferably oxide), is formed planar with the NFET and PFET gate regions 258, 263 and above the NFET and PFET source/drain silicide areas 256, 266.

Figure 7:
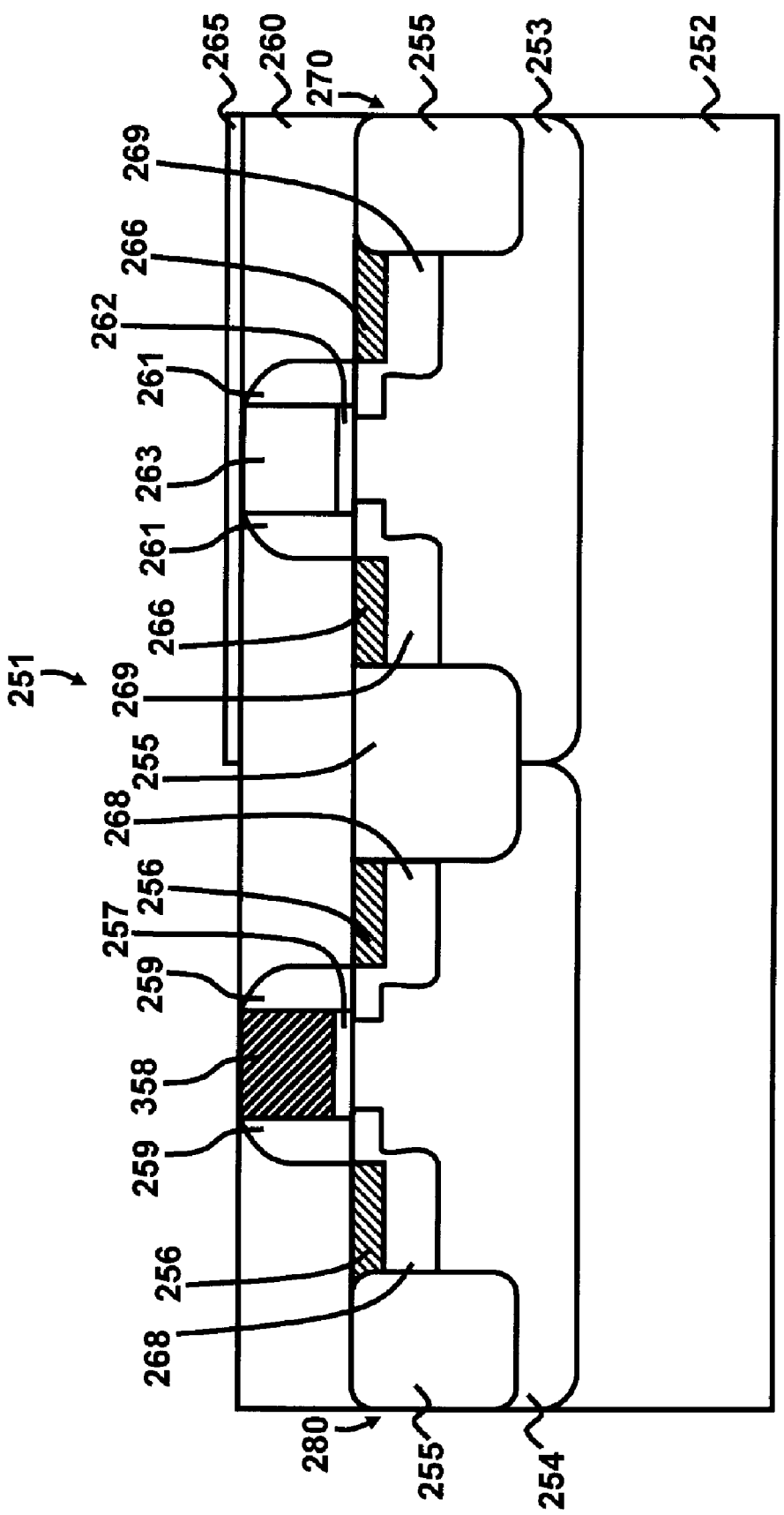

A first metal layer 218 is then deposited over the device 251. Optionally, a first cap layer (not shown) may be formed over the first metal layer 218 to prevent oxidation of the silicide during the subsequent annealing process. Furthermore, those skilled in the art would readily understand how to incorporate the optional cap layer over the first metal layer 218. A full silicide process is performed on the NFET gate region 258 (by annealing) to form a FUSI NFET gate region 358 as shown in FIG. 7. The silicide materials may include NiSi, $CoSi_2$, $TiSi_2$, $WSi_2$, PdSi, PtSi, $TaSi_2$, ReSi, etc., and their alloys. For clarity, in the drawings, the NFET gate region 258 becomes the FUSI NFET gate region 358 (denoted by the hatched lines) upon silicidation.

Figure 8:
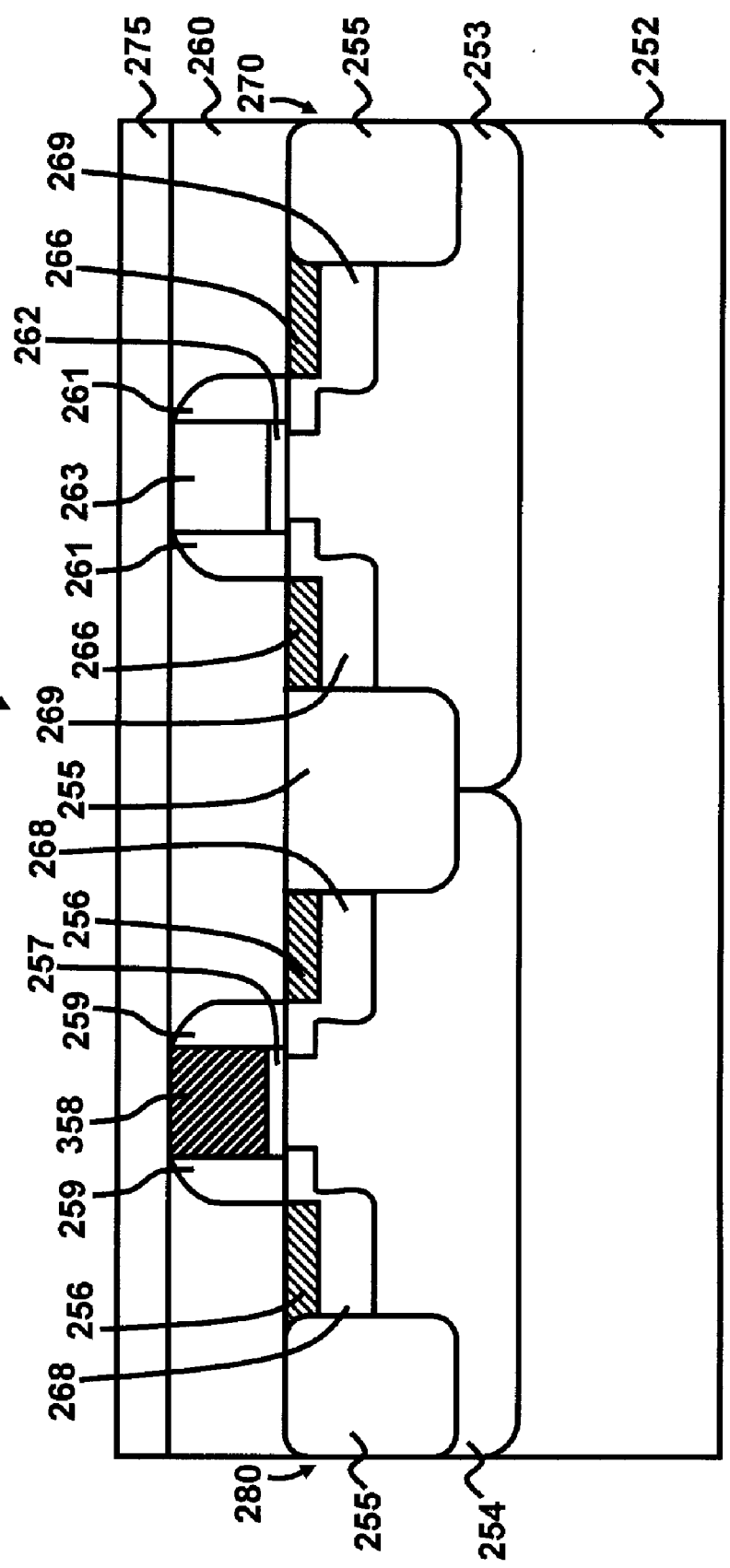
Figure 9:
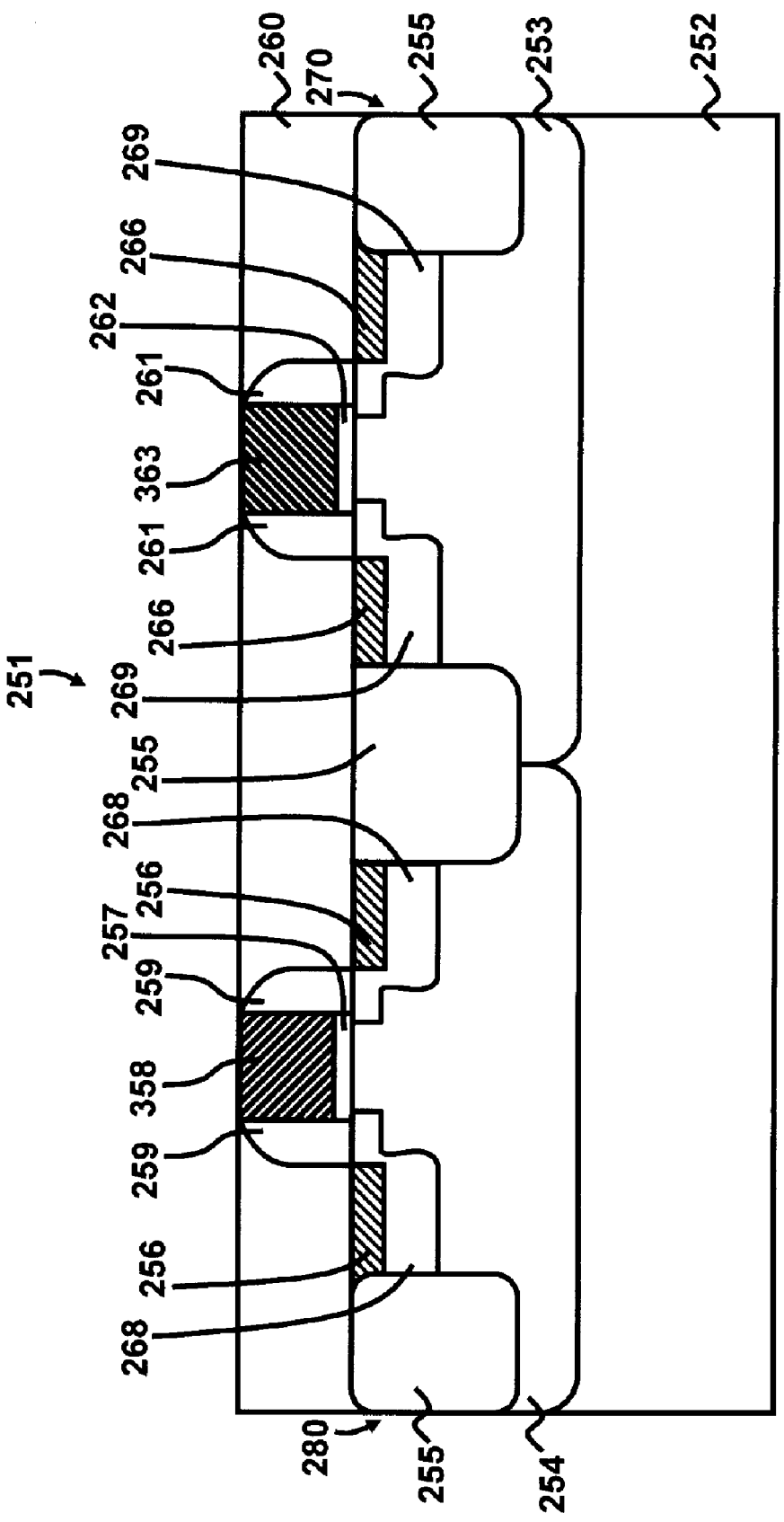

Next, as illustrated in FIG. 8, a wet etch is then performed to selectively remove the optional cap layer, the un-reacted metal of the first metal layer 218, and the silicide blocking film 265 from the dielectric layer 260. Then, a second metal layer 275 is deposited over the entire device 251, and specifically over the dielectric layer 260 and the FUSI NFET gate 358 and PFET gate 263 (i.e., over both the NFET 280 and PFET 270 regions). Optionally, a second cap layer (not shown) may be formed over the second metal layer 275 to prevent oxidation of the silicide during the subsequent annealing process. Furthermore, those skilled in the art would readily understand how to incorporate the optional cap layer over the second metal layer 275. Thereafter, as depicted in FIG. 9, a full silicide process is performed on the PFET gate region 263 (by annealing) to form a FUSI PFET gate region 363. The silicide materials may include NiSi, $CoSi_2$, $TiSi_2$, $WSi_2$, PdSi, PtSi, $TaSi_2$, ReSi, etc., and their alloys. For clarity, in the drawings, the PFET gate region 263 becomes the fully silicided PFET gate region 363 (denoted by the hatched lines) upon salicidation. A wet etch is then performed to selectively removed the optional capping layer and the un-reacted metal of the second metal layer 275.

As shown in FIG. 9, the PFET FUSI gate region 363 is formed of a different material than the NFET FUSI gate region 358. As indicated by the uniform hatching designation in FIGS. 6 through 9, the NFET source/drain silicide areas (contacts) 256 and PFET source/drain silicide areas (contacts) 266 generally comprise the same silicide material. However, they may alternatively comprise different silicide materials.

Moreover, the dual FUSI gate formation process provided by the first embodiment of the invention is performed with only one lithography patterning and etching process having to be performed on the silicide blocking film 265. As such, a second blocking film is unnecessary, which is contrary to the conventional approaches, thus there is no need for a second patterning process. Moreover, because there is only one patterning process needed, there is no misalignment problem, thereby overcoming the aforementioned misalignment problem often found in conventional methods.

While the above description and accompanying drawings indicate that the NFET region 280 undergoes the self-aligned FUSI gate formation process first, the embodiments of the invention are not limited to such a sequence. Rather, the PFET region 270 could equally and just as optimally undergo the self-aligned FUSI gate formation process first, and the embodiments of the invention are not limited to any particular sequence. In fact, it is preferable to first form the FUSI gate on the side (either NFET side 280 or PFET side 270) of the device 251 that requires a higher thermal budget. In this way, it can minimize the impact on first FUSI gate during formation of the second FUSI gate. In the contexts of the embodiments of the invention, the thermal budget may be lowered using rapid thermal processing (RTP).

Figure 10:
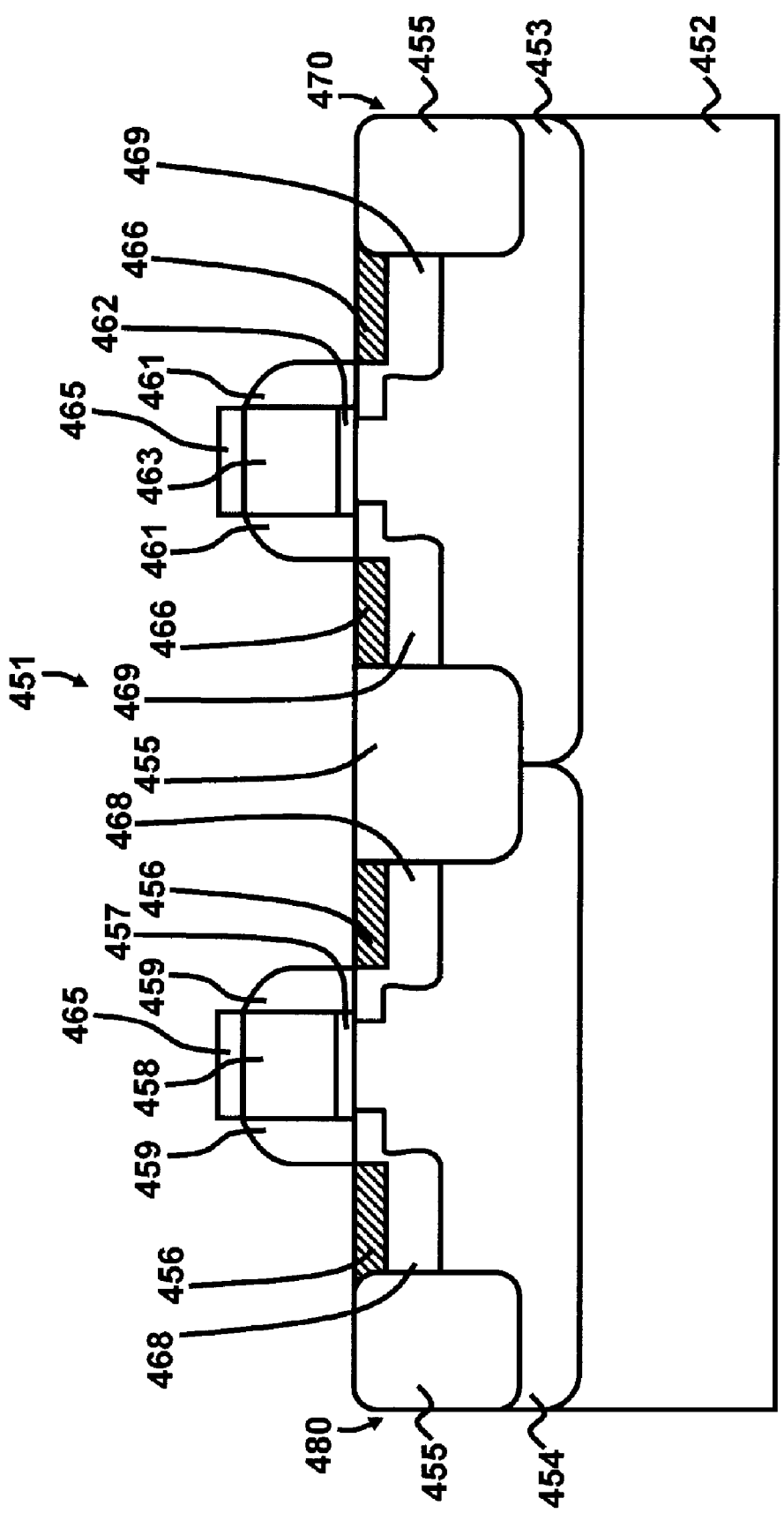
FIGS. 10 through 14 are schematic diagrams illustrating iterative steps of fabricating a self-aligned dual FUSI gate CMOS device according to a second embodiment of the invention.

FIGS. 10 through 14 illustrate iterative steps of fabricating a dual FUSI gate CMOS device 451 according to a second embodiment of the invention. As illustrated in FIG. 10, the CMOS device 451 comprises a NFET region 480 comprising a Pwell 454 formed in a substrate 452 with NFET source/drain implant regions 468, formed in the Pwell 454, with a NFET gate dielectric 457, preferably comprising any of oxide, nitridated oxide, or a high-k material, formed over the Pwell 454, and with a NFET gate 458 formed over the gate dielectric 457. A pair of insulative sidewalls 459, preferably comprising any of oxide, nitride, or oxynitride, is also formed around the NFET gate 458. Additionally, shallow trench isolation regions 455 are also included in the CMOS device 451 to provide electrical isolation between various devices in the CMOS device 451.

In one embodiment, the substrate 452 comprises a single-crystal silicon layer. Alternatively, the substrate 452 may comprise any appropriate semiconducting material, including, but not limited to silicon (Si), germanium (Ge), gallium phosphide (GaP), indium arsenide (InAs), indium phosphide (InP), silicon germanium (SiGe), gallium arsenide (GaAs), or other semiconductors. The PFET region 470 is similarly configured to the NFET region 480, wherein the PFET region 470 includes a Nwell 453 formed in the substrate 452 with PFET source/drain implant regions 469 formed in the Nwell 453, with a PFET gate dielectric 462, preferably comprising any of oxide, nitridated oxide, or a high-k material, formed over the Nwell 453, and with a PFET gate 463 formed over the PFET gate dielectric 462. A pair of insulative sidewalls 461, preferably comprising any of oxide, nitride, or oxynitride, is formed around the PFET gate 463 as well. Moreover, the retrograde well regions (Pwell 454 and Nwell 453) may be formed using any well-known technique such as high-energy ion implantation and annealing.

Figure 11:
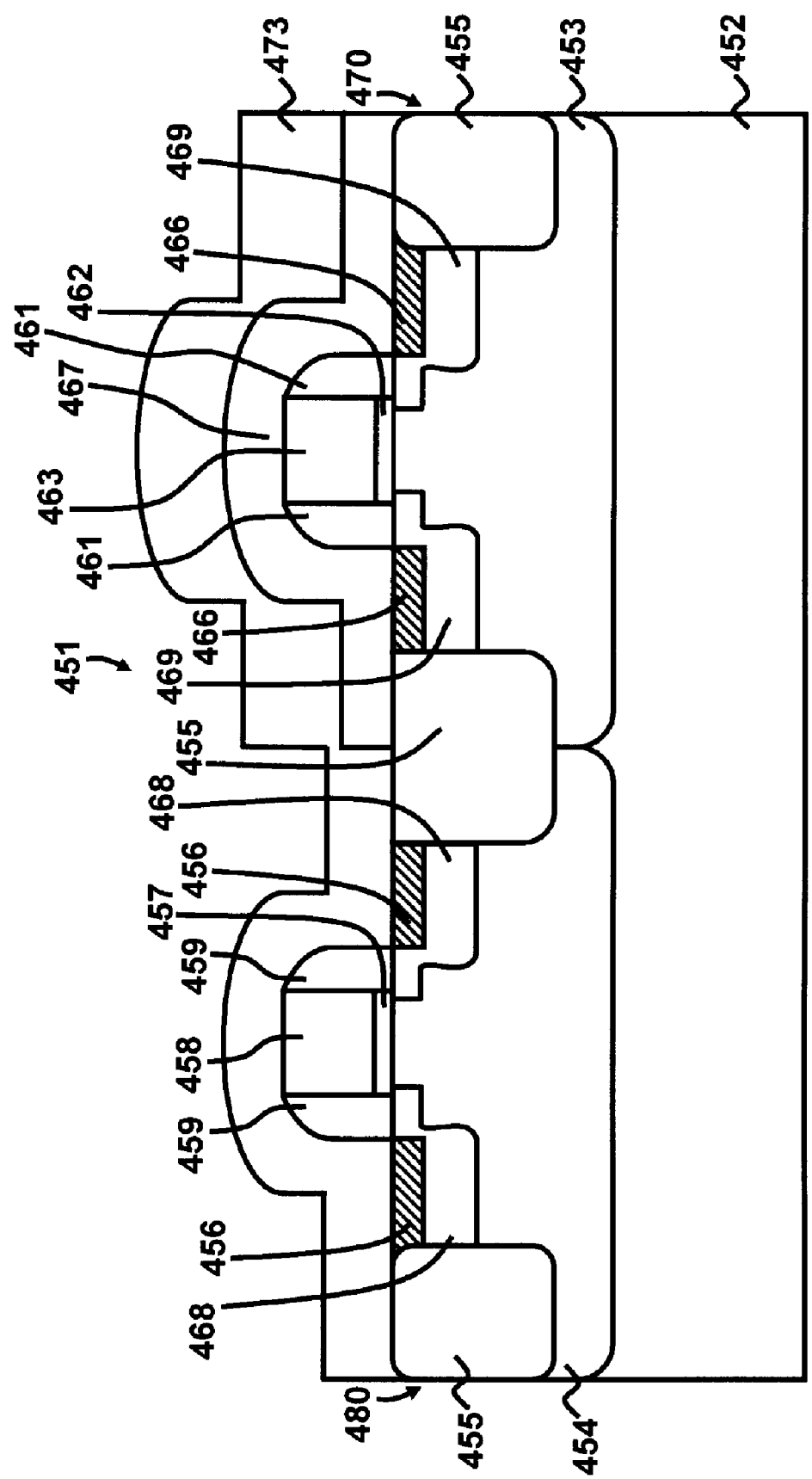

According to the second embodiment of the invention, the dual FUSI gate formation process comprises forming a first silicide block film 465 comprising oxide or nitride (preferably oxide) over each of the NFET gate region 458 and the PFET gate region 463. Then, a salicide process is performed to create source/drain silicide areas (contacts) 456, 466 in each of the NFET region 480 and PFET region 470, respectively. Next, the blocking films 465 are removed from over the NFET gate region 458 and the PFET gate region 463 using a selective etching process. Thereafter, a second silicide blocking film 467 is deposited over the PFET region 470 of the CMOS device 451 as shown in FIG. 11.

Figure 12:
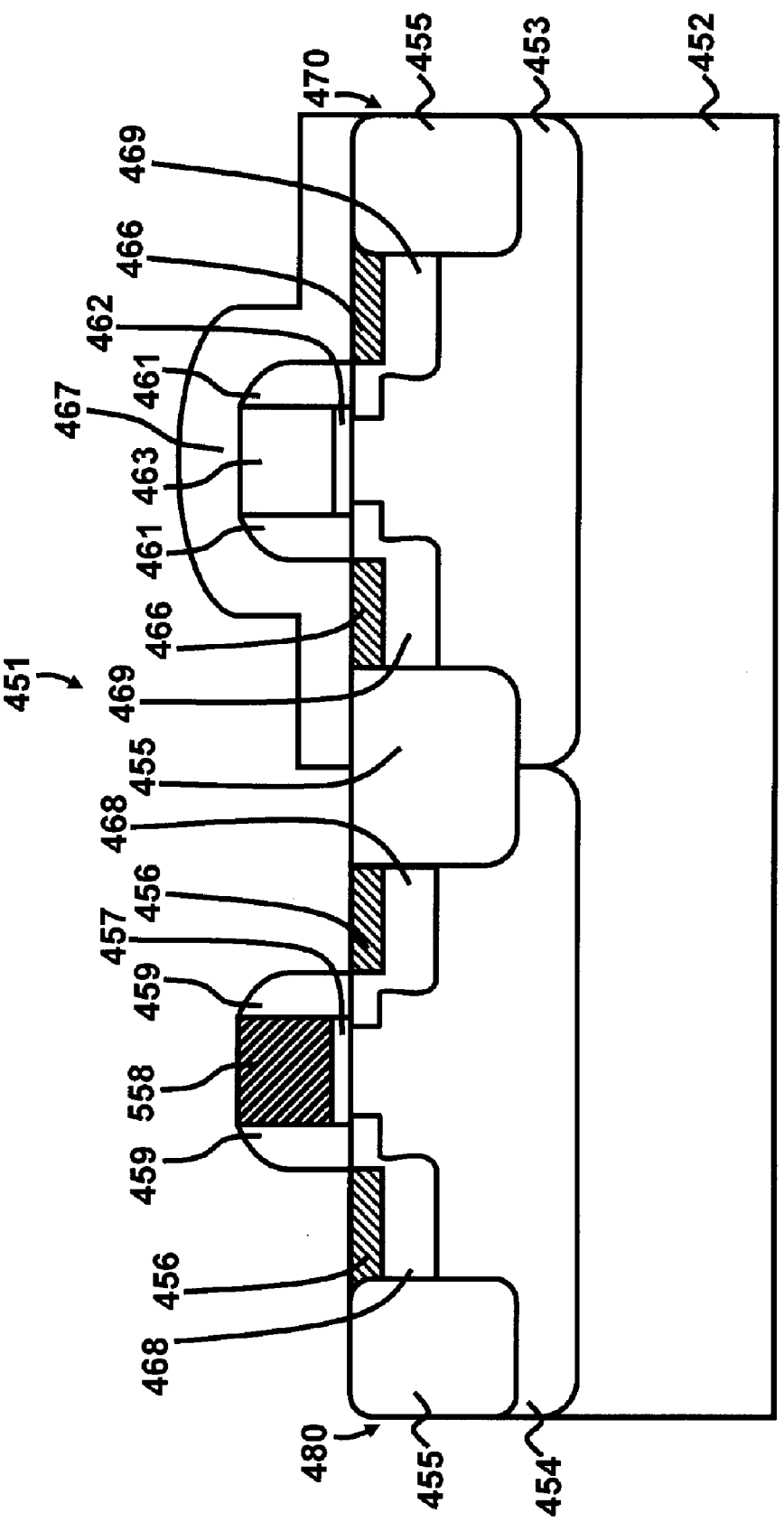

A first metal layer 473 is then deposited over the device 451. Optionally, a first cap layer (not shown) may be formed over the first metal layer 473 to prevent oxidation of the silicide during the subsequent annealing process. Furthermore, those skilled in the art would readily understand how to incorporate the optional cap layer over the first metal layer 473. A silicidation process is then performed on the NFET gate region 458 (by annealing) to form a FUSI NFET gate region 558 as shown in FIG. 12. The silicide materials may include NiSi, $CoSi_2$, $TiSi_2$, $WSi_2$, PdSi, PtSi, $TaSi_2$, ReSi, etc., and their alloys. For clarity, in the drawings, the NFET gate region 458 becomes the FUSI NFET gate region 558 (denoted by the hatched lines) upon salicidation.

Figure 13:
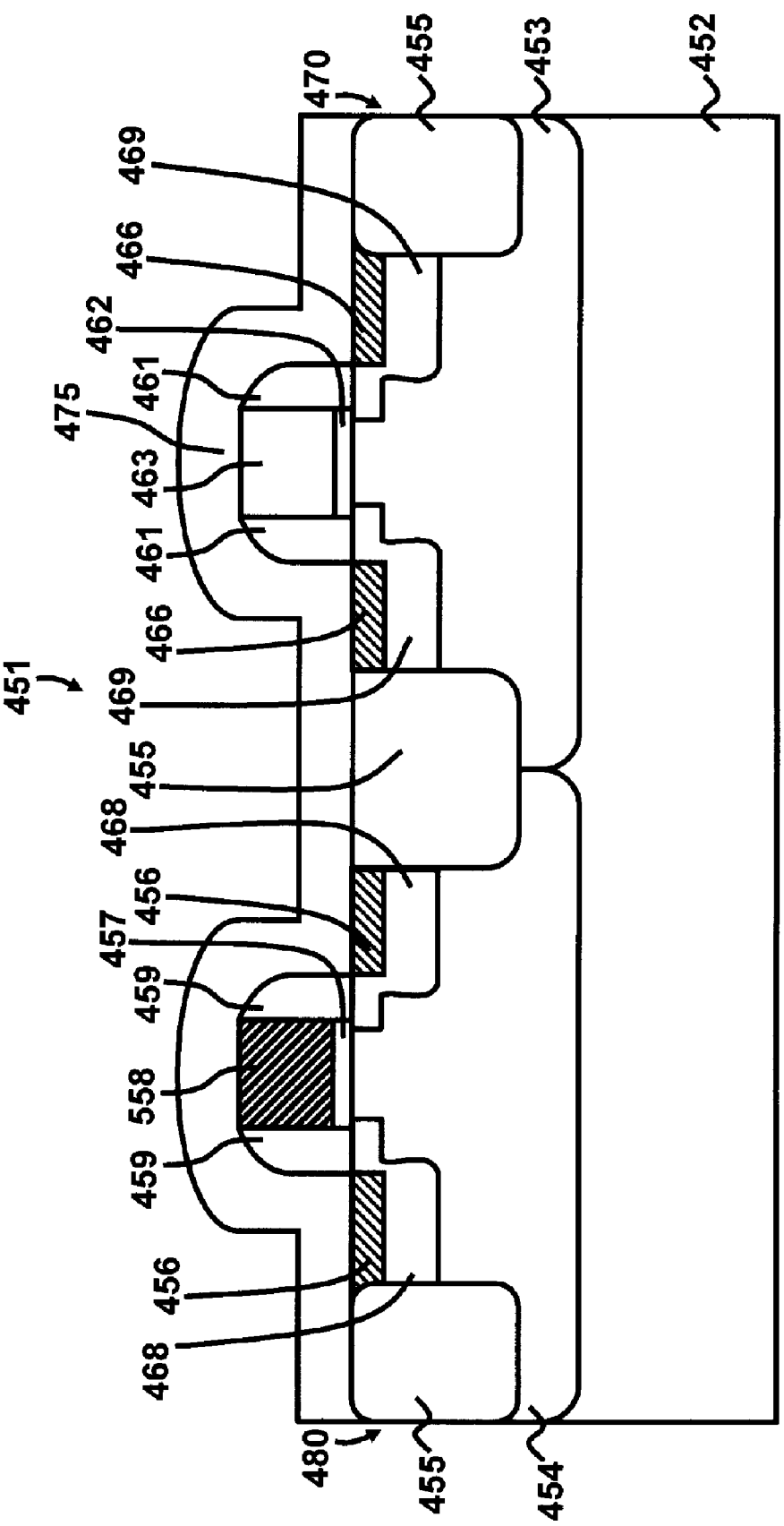
Figure 14:
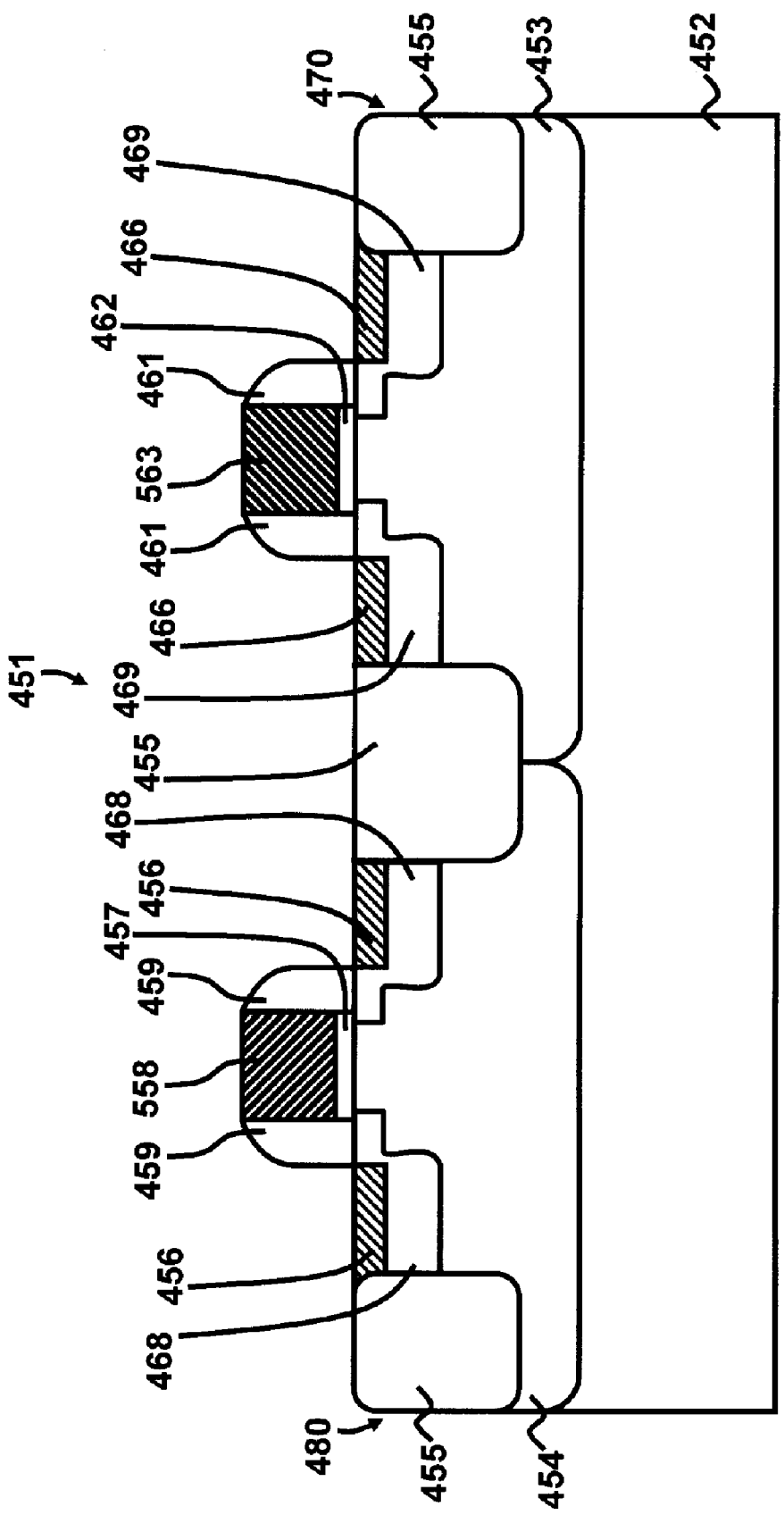

Next, as illustrated in FIG. 13, a wet etch is performed to selectively remove the optional cap layer, the un-reacted metal of the first metal layer 473, and the silicide blocking film 467 from the dielectric layer 260. Then, a second metal layer 475 is deposited over the entire device 451. Optionally, a second cap layer (not shown) may be formed over the second metal layer 475 to prevent oxidation of the silicide during the subsequent annealing process. Furthermore, those skilled in the art would readily understand how to incorporate the optional cap layer over the second metal layer 475. Thereafter, as depicted in FIG. 14, a full silicide process is performed on the PFET gate region 463 to form a FUSI PFET gate region 563. The silicide materials may include NiSi, $CoSi_2$, $TiSi_2$, $WSi_2$, PdSi, PtSi, $TaSi_2$, ReSi, etc., and their alloys. For clarity, in the drawings, the PFET gate region 463 becomes the FUSI PFET gate region 563 (denoted by the hatched lines) upon salicidation. A wet etch is then performed to selectively remove the optional cap layer and the un-reacted metal of the second metal layer 475. As shown in FIG. 14, the FUSI PFET gate region 563 is formed of a different material than the FUSI NFET gate region 558.

While the above description and accompanying drawings indicate that the NFET region 480 undergoes the self-aligned FUSI gate formation process first, the embodiments of the invention are not limited to such a sequence. Rather, the PFET region 470 could equally and just as optimally undergo the self-aligned FUSI gate formation process first, and the embodiments of the invention are not limited to any particular sequence. In fact, it is preferable to first form the FUSI gate on the side (either NFET side 480 or PFET side 470) of the device 451 that requires a higher thermal budget. In this way, it can minimize the impact on first FUSI gate during formation of the second FUSI gate. In the contexts of the embodiments of the invention, the thermal budget may be lowered using rapid thermal processing (RTP).

FIGS. 15(A) through 15(F) illustrate iterative steps of fabricating a self-aligned dual FUSI gate CMOS device according to an embodiment of the invention. For example, for NiSi over $CoSi_2$, the following sequence (as shown in FIGS. 15(A) through 15(F)) could be implemented. The process begins with a Si base 301 (FIG. 15(A)) followed by deposition of a Co/TiN layer 302 over the Si base 301 (FIG.

Figure 15B:
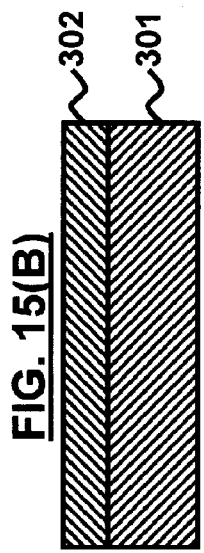
FIGS. 15(A) through 15(F) are schematic diagrams illustrating iterative steps of fabricating a self-aligned dual FUSI gate CMOS device according to an embodiment of the invention.
Figure 15D:
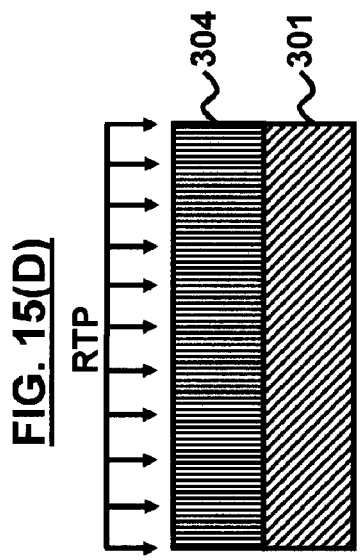
Figure 15F:
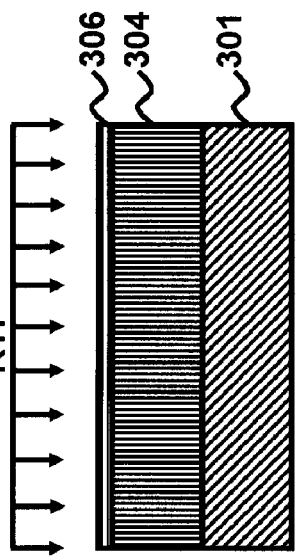
Figure 15A:
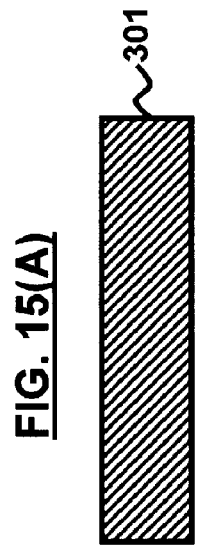
Figure 15C:
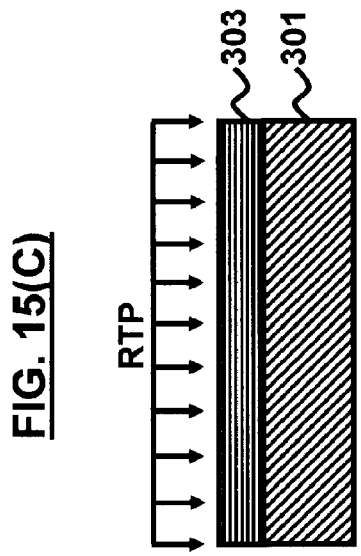
Figure 15E:
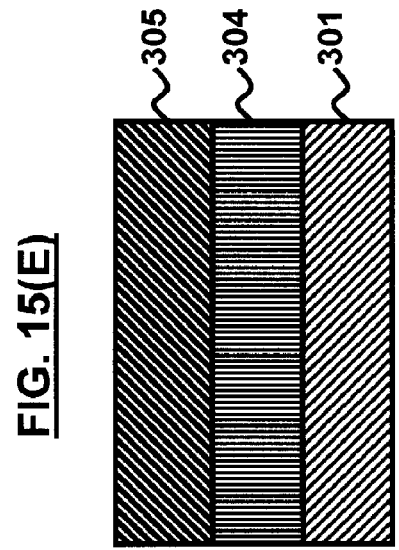

15(B)). Then, as shown in FIG. 15(C) a first RTP is performed to form a CoSi layer 303. Next, the TiN and un-reacted Co is stripped and a second RTP is performed to form the $CoSi_2$ layer 304 (FIG. 15(D)). Thereafter, a Ni/TiN layer 305 is deposited over the $CoSi_2$ layer 304 as shown in FIG. 15(E). Next, a third RTP is performed to mimic the condition for NiSi FUSI gate formation. Moreover, there may remain a very thin layer of a mixture of NiSi and $CoSi_2$ 306 at the top of the first silicide 304, $CoSi_2$ in this case, after the TiN layer and un-reacted Ni layer are stripped away as illustrated in FIG. 15(F).

Figure 16:
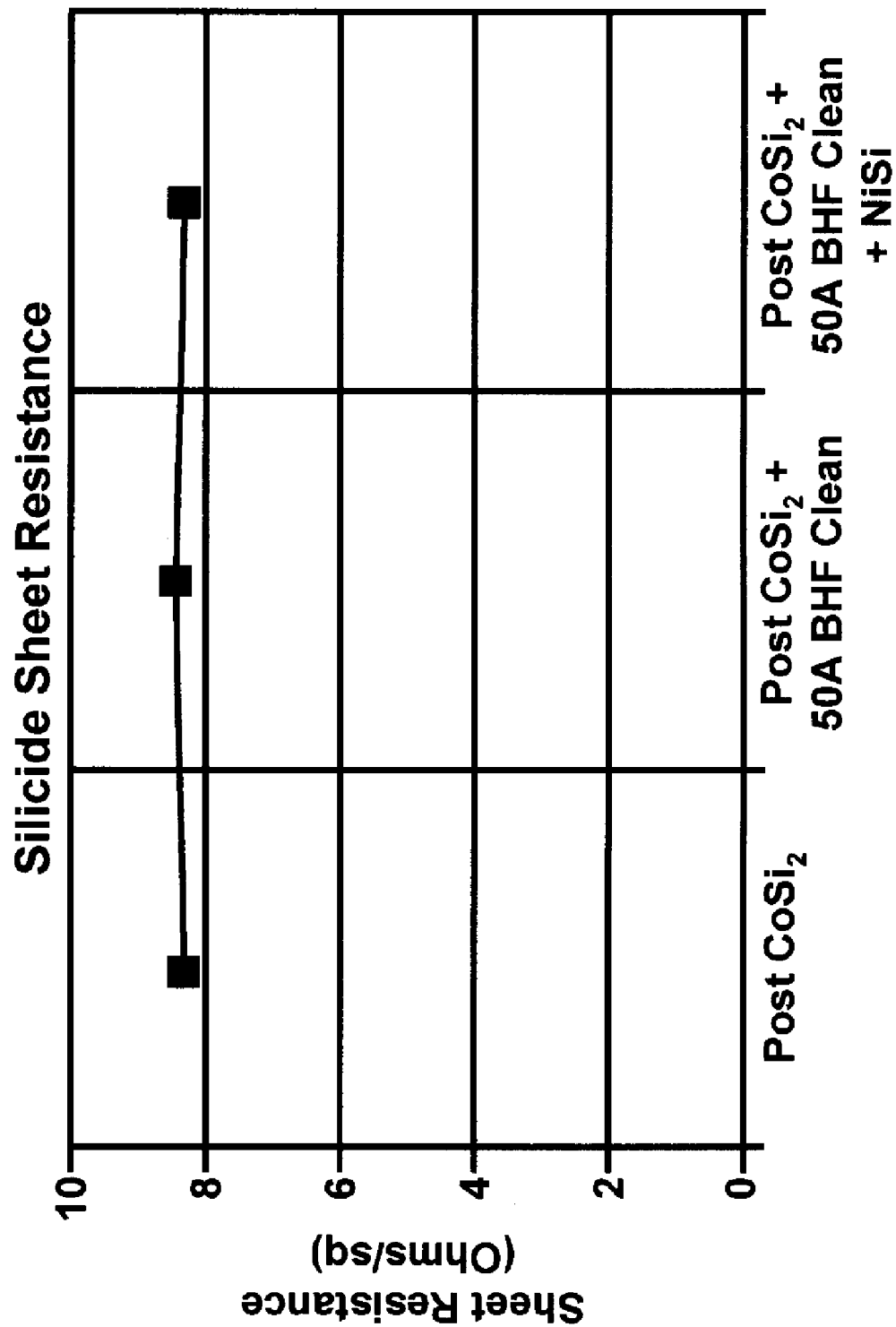
FIG. 16 is a graphical representation illustrating the silicide sheet resistance according to an embodiment of the invention.

FIG. 16 illustrates the silicide sheet resistance during three steps in the NiSi over $CoSi_2$ process illustrated in FIGS. 15(A) through 15(F). As illustrated in FIG. 16, there is no significant sheet resistance change from the first phase (post $CoSi_2$ formation) to the second phase (post $CoSi_2$ formation+50A BHF (buffered hydrofluoric acid; i.e. BOE (buffered oxide etch)) cleaning) to the third phase (post $CoSi_2$+50A BHF cleaning+NiSi formation anneal). In fact, the sheet resistance remains fairly constant throughout the three phases at approximately 8.1–8.2 Ohms/sq. Having no significant sheet resistance change is advantageous because it indicates that almost none of the second silicide (NiSi) is formed over the first silicide ($CoSi_2$). This is confirmed by the Auger electron depth profile analysis shown in FIG. 17.

Figure 17:
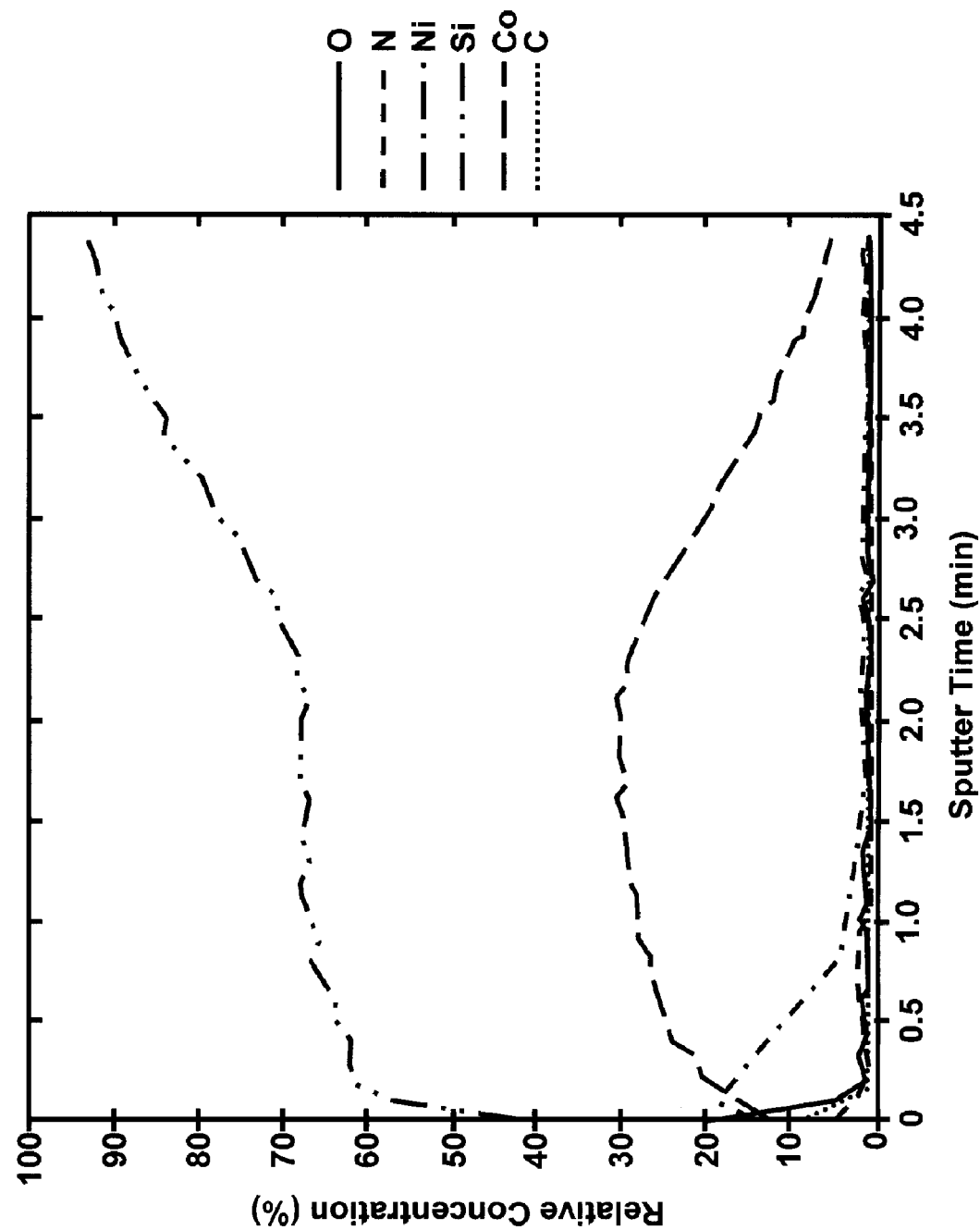
FIG. 17 is a graphical representation illustrating the relative concentration percentage versus the sputter time of a self-aligned dual FUSI gate structure as shown in FIG. 15(F)

FIG. 17 illustrates the depth profile of the relative concentration (%) of the various materials from the final silicide 306. It shows there is only a thin layer at the top of the final silicide having some Ni mixed in the Co silicide. From FIGS. 16 and 17, it confirmed that different silicided FUSI gates can be formed by the embodiments of this invention.

A process flow diagram according to an embodiment of the invention is illustrated in the flowchart of FIG. 18, which includes descriptions which refer to components provided in FIGS. 6 through 17, whereby FIG. 18 depicts a method of manufacturing an integrated circuit 251 comprising FUSI gates 258, 263 over a semiconductor substrate 252, wherein the method comprises forming (601) a first type semiconductor device 270 having a first well region 253 in the semiconductor substrate 252, first source/drain silicide areas 266 in the first well region 253, and a first type gate region 263 isolated from the first source/drain silicide areas 266.

Next, the method involves forming (603) a second type semiconductor device 280 having a second well region 254 in the semiconductor substrate 252, second source/drain silicide areas 256 in the second well region 254, and a second type gate region 258 isolated from the second source/drain silicide areas 256. Thereafter, the process involves selectively forming (605) a first metal layer 218 over the second type semiconductor device 280; performing (607) a first FUSI gate formation on only the second type gate region 258 (becoming FUSI gate region 358); and depositing (609) a second metal layer 275 over the first type semiconductor device 270 and the second type semiconductor device 280. The next step of the method involves performing (611) a second FUSI gate formation on only the first type gate region 263 (becoming FUSI gate region 363), wherein the first metal layer 218 is formed of different materials than the second metal layer 275, and wherein the first metal layer 218 and second metal layer 275 are formed of any of Ti, Co, Ni, Pt, Re, W, Pd, Ta, and their alloys.

The first type semiconductor device 270 is formed by configuring an insulator layer 262 over the first well region 253; configuring the first type gate region 263 over the insulator layer 262; and forming insulative spacers 261 on opposite sides of the first type gate region 263, wherein the second FUSI gate formation is performed on an entirety of the first type gate region 263 (becoming FUSI gate region 363), wherein the entirety of the first type gate region 263 comprises an area extending from a lower surface of the first type gate region 263 contacting the insulator layer 262 to an upper surface of the first type gate region 263.

In a first embodiment, the first well region 253 is configured as any of a NFET well region and a PFET well region. In a second embodiment, the second well region 254 is configured as any of a NFET well region and a PFET well region. The second type semiconductor device 280 is formed by configuring an insulator layer 257 over the second well region 254; configuring the second type gate region 258 over the insulator layer 257; and forming insulative spacers 259 on opposite sides of the second type gate region 258, wherein the first FUSI gate formation is performed on an entirety of the second type gate region 258 (becoming FUSI gate region 358), wherein the entirety of the second type gate region 258 comprises an area extending from a lower surface of the second type gate region 258 contacting the insulator layer 257 to an upper surface of the second type gate region 258.

The method further comprises forming a cap layer (not shown) over each of the first metal layer 218 and the second metal layer 275, wherein the cap layer (not shown) comprises any of TiN, Ti, and TaN, wherein each of the first and second type gate regions 263, 258 comprise polysilicon material, and wherein each of the first and second FUSI gate formations comprise performing a first annealing process to convert the polysilicon material into a metal rich silicide having a first level silicide sheet resistance; then the un-reacted metal is selectively removed; next the cap layer (not shown) is removed together with the un-reacted metal or separately; and a second annealing process is performed to convert the metal rich silicide into silicide having a second level silicide sheet resistance lower than the first level silicide sheet resistance. The second annealing process also forms FUSI gates.

Generally, the embodiments of the invention provide a self-aligning dual FUSI gate formation (i.e., different FUSI gate formations), such as NiSi, $CoSi_2$, $TiSi_2$, $WSi_2$, PdSi, PtSi, $TaSi_2$, ReSi, etc., and their alloys at the gate areas 358, 363 for NFET 280 and PFET 270 regions of a CMOS device 251 with only one lithography level. As such, the embodiments of the invention reduce the required lithography level, greatly simplify the dual FUSI gate formation process, and eliminate the misalignment problem associated with some conventional techniques. Moreover, the embodiments of the invention enable the optimization of the performance of the CMOS device 251 by forming one silicide in the NFET gate region 358 and a different silicide in the PFET gate region 363.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. A method of forming an integrated circuit on a semiconductor substrate, said method comprising:
    forming a first type semiconductor device having first source/drain silicide areas and a first type gate region isolated from said first source/drain silicide areas;
    forming a second type semiconductor device having second source/drain silicide areas and a second type gate region isolated from said second source/drain silicide areas;
    forming a dielectric layer over all of said first and second source/drain silicide areas;
    depositing a first metal layer over said second type semiconductor device;
    performing a first fully silicided (FUSI) gate formation on only said second type gate region;
    depositing a second metal layer over both of the first and second type semiconductor devices;
    forming a cap layer over each of said first metal layer and said second metal layer; and
    performing a second FUSI gate formation on only said first type gate region.

2. The method of claim 1, wherein said first FUSI gate formation is performed on an entirety of said second type gate region, and wherein said second FUSI gate formation is performed on an entirety of said first type gate region.

3. The method of claim 1, further comprising shielding said first type semiconductor device with a mask prior to deposition of said first metal layer.

4. The method of claim 3, further comprising removing said mask after performing said first FUSI gate formation.

5. The method of claim 1, wherein said first metal layer is formed of different materials than said second metal layer.

6. The method of claim 1, wherein said first type semiconductor device is formed by:
    configuring an insulator layer over a first well region;
    configuring said first type gate region over said insulator layer; and
    forming insulative spacers on opposite sides of said first type gate region.

7. The method of claim 6, wherein said first FUSI gate formation is performed on an entirety of said second type gate region, and wherein said entirety of said second type gate region comprises an area extending from a lower surface of said second type gate region contacting said insulator layer to an upper surface of said second type gate region.

8. The method of claim 6, wherein said first well region is configured as any of a NFET (N-type field effect transistor) well region and a PFET (P-type field effect transistor) well region.

9. The method of claim 1, wherein said second type semiconductor device is formed by:
    configuring an insulator layer over a second well region;
    configuring said second type gate region over said insulator layer; and
    forming insulative spacers on opposite sides of said second type gate region.

10. The method of claim 9, wherein said second FUSI gate formation is performed on an entirety of said first type gate region, and wherein said entirety of said first type gate region comprises an area extending from a lower surface of said first type gate region contacting said insulator layer to an upper surface of said first type gate region.

11. The method of claim 9, wherein said second well region is configured as any of a NFET (N-type field effect transistor) well region and a PFET (P-type field effect transistor) well region.

12. The method of claim 1, wherein said first metal layer and second metal layer are formed of any of Ti, Co, Ni, Pt, Re, W, Pd, Ta, and their alloys.

13. The method of claim 1, wherein said integrated circuit is formed in only one lithography level.

14. The method of claim 1, wherein said cap layer comprises any of TiN, Ti, and TaN.

15. The method of claim 1, wherein each of the first and second type gate regions comprise polysilicon material, and wherein each of the first and second FUSI gate formations comprise:
    performing a first annealing process to convert said polysilicon material into a metal rich silicide having a first level silicide sheet resistance;
    removing un-reacted metal and said cap layer; and
    performing a second annealing process to convert said metal rich silicide into silicide having a second level silicide sheet resistance lower than said first level silicide sheet resistance.

16. A method of fabricating a self-aligned dual fully silicided (FUSI) gate in a complementary metal oxide semiconductor (CMOS) device, said method comprising:
    forming a first type semiconductor device having a first well region in a semiconductor substrate, first source/drain silicide areas in said first well region, and a first type gate region isolated from said first source/drain silicide areas;
    forming a second type semiconductor device having a second well region in said semiconductor substrate, second source/drain silicide areas in said second well region, and a second type gate isolated from said second source/drain silicide areas;
    forming a dielectric layer over each of said first and second source/drain silicide areas;
    shielding said first type semiconductor device with a mask;
    depositing a first metal layer over said second type semiconductor device;
    performing a first FUSI gate formation on said second type gate region;
    removing said mask;
    depositing a second metal layer over the first and second type semiconductor devices;
    forming a cap layer over each of said first metal layer and said second metal layer; and
    performing a second FUSI gate formation on said first type gate region.

17. The method of claim 16, wherein said first FUSI gate formation is performed on an entirety of said second type gate region, and wherein said second FUSI gate formation is performed on an entirety of said first type gate region.

18. The method of claim 16, wherein said first well region is configured as a NFET (N-type field effect transistor) well region and said second well region is configured as a PFET (P-type field effect transistor) well region.

19. The method of claim 16, wherein said first well region is configured as a PFET (P-type field effect transistor) well region and said second well region is configured as a NFET (N-type field effect transistor) well region.

20. The method of claim 16, wherein said first metal layer is formed of different materials than said second metal layer.

21. The method of claim 16, wherein said first type semiconductor device is formed by:

configuring an insulator layer over said first well region;
configuring said first type gate region over said insulator layer; and
forming insulative spacers on opposite sides of said first type gate region.

22. The method of claim 21, wherein said second FUSI gate formation is performed on an entirety of said first type gate region, and wherein said entirety of said first type gate region comprises an area extending from a lower surface of said first type gate region contacting said insulator layer to an upper surface of said first type gate region.

23. The method of claim 16, wherein said second type semiconductor device is formed by:
configuring an insulator layer over said second well region;
configuring said second type gate region over said insulator layer; and
forming insulative spacers on opposite sides of said second type gate region.

24. The method of claim 23, wherein said first FUSI gate formation is performed on an entirety of said second type gate region, and wherein said entirety of said second type gate region comprises an area extending from a lower surface of said second type gate region contacting said insulator layer to an upper surface of said second type gate region.

25. The method of claim 16, wherein said first metal layer and said second metal layer are formed of any of Ti, Co, Ni, Pt, Re, W, Pd, Ta, and their alloys.

26. The method of claim 16, wherein said integrated circuit is formed in only one lithography level.

27. The method of claim 16, wherein said cap layer comprises any of TiN, Ti, and TaN.

28. The method of claim 16, wherein each of the first and second type gate regions comprise polysilicon material, and wherein each of the first and second FUSI gate formations comprise:
performing a first annealing process to convert said polysilicon material into a metal rich silicide having a first level silicide sheet resistance;
removing un-reacted metal and said cap layer; and
performing a second annealing process to convert said metal rich silicide into silicide having a second level silicide sheet resistance lower than said first level silicide sheet resistance.

29. A method of manufacturing an integrated circuit comprising only one lithography level and comprising fully silicided (FUSI) gates over a semiconductor substrate, said method comprising:
forming a first type semiconductor device having a first well region in said semiconductor substrate, first source/drain silicide areas in said first well region, and a first type gate region isolated from said first source/drain silicide areas;
forming a second type semiconductor device having a second well region in said semiconductor substrate, source/drain silicide areas in said second well region, and a second type gate region isolated from said second source/drain silicide areas;
selectively forming a first metal layer over said second type semiconductor device;
performing a first FUSI gate formation on only said second type gate region;
depositing a second metal layer over said first type semiconductor device and said second type semiconductor device;
forming a cap layer over each of said first metal layer and said second metal layer; and
performing a second FUSI gate formation on only said first type gate region,
wherein a silicide sheet resistance in said integrated circuit during the first and second FUSI gate formations remains substantially constant.

30. The method of claim 29, wherein said first metal layer is formed of different materials than said second metal layer, and wherein said first metal layer and second metal layer are formed of any of Ti, Co, Ni, Pt, Re, W, Pd, Ta, and their alloys.

31. The method of claim 29, wherein said first type semiconductor device is formed by:
configuring an insulator layer over said first well region;
configuring said first type gate region over said insulator layer; and
forming insulative spacers on opposite sides of said first type gate region,
wherein said second FUSI gate formation is performed on an entirety of said first type gate region, and wherein said entirety of said first type gate region comprises an area extending from a lower surface of said first type gate region contacting said insulator layer to an upper surface of said first type gate region.

32. The method of claim 29, wherein said first well region is configured as any of a NFET (N-type field effect transistor) well region and a PFET (P-type field effect transistor) well region.

33. The method of claim 29, wherein said second type semiconductor device is formed by:
configuring an insulator layer over said second well region;
configuring said second type gate region over said insulator layer; and
forming insulative spacers on opposite sides of said second type gate region,
wherein said first FUSI gate formation is performed on an entirety of said second type gate region, and wherein said entirety of said second type gate region comprises an area extending from a lower surface of second first type gate region contacting said insulator layer to an upper surface of said second type gate region.

34. The method of claim 29, wherein said second well region is configured as any of a NFET (N-type field effect transistor) well region and a PFET (P-type field effect transistor) well region.

35. The method of claim 29, wherein said cap layer comprises any of TiN, Ti, and TaN.

36. The method of claim 35, wherein each of the first and second type gate regions comprise polysilicon material, and wherein each of the first and second FUSI gate formations comprise:
performing a first annealing process to convert said polysilicon material into a metal rich silicide;
removing un-reacted metal and said cap layer; and
performing a second annealing process to convert said metal rich silicide into an altered silicide.

* * * * *